(12) United States Patent
Yug

(10) Patent No.: US 11,515,514 B2
(45) Date of Patent: Nov. 29, 2022

(54) METHOD OF MANUFACTURING DISPLAY DEVICE

(71) Applicant: Samsung Display Co., LTD., Yongin-si (KR)

(72) Inventor: Geunwoo Yug, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 163 days.

(21) Appl. No.: 17/120,981

(22) Filed: Dec. 14, 2020

(65) Prior Publication Data

US 2021/0320282 A1    Oct. 14, 2021

(30) Foreign Application Priority Data

Apr. 14, 2020   (KR) .......................... 10-2020-0045313

(51) Int. Cl.
*H01L 51/56* (2006.01)
*H01L 51/00* (2006.01)
*H01L 51/52* (2006.01)

(52) U.S. Cl.
CPC .......... *H01L 51/56* (2013.01); *H01L 51/0027* (2013.01); *H01L 51/5293* (2013.01); *H01L 2251/5338* (2013.01)

(58) Field of Classification Search
None
See application file for complete search history.

(56) References Cited

U.S. PATENT DOCUMENTS

| 10,326,113 | B2 | 6/2019 | Yug |
| 10,541,388 | B2 | 1/2020 | Yug |
| 10,665,784 | B2* | 5/2020 | Yug .................... H01L 51/0009 |
| 10,871,802 | B2* | 12/2020 | Yug ........................ B32B 27/08 |
| 11,335,884 | B2* | 5/2022 | Andou .................... H01L 51/56 |
| 2019/0165049 | A1* | 5/2019 | Kim .................... H01L 51/5281 |

FOREIGN PATENT DOCUMENTS

KR       1020180063936 A       6/2018

* cited by examiner

*Primary Examiner* — J. E. Schoenholtz
(74) *Attorney, Agent, or Firm* — Cantor Colburn LLP

(57) ABSTRACT

A manufacturing method of a display device includes irradiating a laser beam onto a work panel along a beam irradiation line corresponding to an outer edge of the display device including a first thickness area and a second thickness area. The irradiating of the laser beam includes first irradiating the laser beam under a first driving condition to provide a first portion of the beam irradiation line at the first area, stopping driving of the laser beam while changing the first driving condition to a second driving condition different from the first driving condition, after the first irradiating of the laser beam, and second irradiating the laser beam under the second driving condition to provide a second portion of the beam irradiation line at the second area, after the stopping of the driving of the laser beam.

19 Claims, 18 Drawing Sheets

METHOD OF MANUFACTURING DISPLAY DEVICE

This application claims priority to Korean Patent Application No. 10-2020-0045313, filed on Apr. 14, 2020, and all the benefits accruing therefrom under 35 U.S.C. § 119, the contents of which are hereby incorporated by reference in its entirety.

BACKGROUND

1. Field

One or more embodiment relates to a method of manufacturing a display device. More particularly, one or more embodiment relates to a method of manufacturing a display device using a laser unit.

2. Description of the Related Art

An electronic apparatus that provides an image, such as a display monitor, a smartphone, a tablet computer or the like, includes a display device. The display device generates the image and provides the image to outside the display device, through a display screen.

With technological development of the display device, a flexible display device is being developed. The flexible display device includes a bendable display device that is bendable at a non-display area, a rollable display device that is entirely rollable, or a foldable display device that is foldable at a display area. The flexible display device includes different stacking structures depending on areas thereof for smooth bending, rolling, or folding.

SUMMARY

One or more embodiment provides a method of manufacturing a display device with low defect rate.

One or more embodiment provides a method of manufacturing a display device. The manufacturing method of the display device includes providing a work panel (e.g., preliminary display device) including a first area having a first stack structure and a second area having a second stack structure which is different from the first stack structure, and irradiating a laser beam onto the work panel along a beam irradiation line corresponding to an outer edge of the display device. The irradiating of the laser beam includes a first irradiation stage (e.g., first irradiation process) which irradiates the laser beam under a first driving condition to provide a first portion of the beam irradiation line which corresponds to the first area, a first rest stage (e.g., first rest process) which stops driving of the laser beam while changing the first driving condition to a second driving condition different from the first driving condition, after the first irradiation stage, and a second irradiation stage (e.g., second irradiation process) which irradiates the laser beam under the second driving condition to provide a second portion of the beam irradiation line which corresponds to the second area, after the first rest stage.

The beam irradiation line may include a closed line shape.

The second portion may include a curved line shape.

The portion having the curved line shape may be a portion of the second portion adjacent to the first portion.

The first rest stage may be maintained for a period from about 1 microsecond to about 500 microseconds.

The work panel may include a display panel overlapping the first area and the second area, a polarizing film overlapping the first area, and a protective film overlapping the first area and the second area.

The work panel may further include a third area having a third stack structure different from the first and second stack structures.

The work panel further may further include a third area having a third stack structure different from the first and second stack structures, each of the display panel and the protective film may further overlap the third area, and a portion of the protective film, which overlaps the second area, may be provided with a groove.

The method may further include a second rest stage (e.g., second rest process) and a third irradiation stage (e.g., third irradiation process). The work panel further may further include a third area having a third stack structure different from the first and second stack structures, the second rest stage may include stopping the driving of the laser beam while changing the second driving condition of the laser beam to a third driving condition different from the first and second driving conditions of the laser beam, after the second irradiation stage, and the third irradiation stage may include irradiating the laser beam under the third driving condition to provide a third portion of the beam irradiation line which corresponds to the third area, after the second rest stage.

At least one of a frequency, a power and a moving speed of the laser beam of the first driving condition may be different from that of the laser beam of the second driving condition.

The frequency and the moving speed of the laser beam of the first driving condition may be the same as the frequency and the moving speed of the laser beam of the second driving condition, and the power of the laser beam of the first driving condition may be different from the power of the laser beam of the second driving condition.

One or more embodiment provides a method of manufacturing a display device. The manufacturing method of the display device includes providing a work panel including a first area having a first stack structure and a second area having a second stack structure which is different from the first stack structure and irradiating a laser beam onto the work panel to provide a beam irradiation line corresponding to an outer edge of the display device. The irradiating of the laser beam includes a first irradiation stage which irradiates the laser beam under a first driving condition to provide a first portion of the beam irradiation line which corresponds to the first area, a first rest stage which stops driving of the laser beam after the first irradiation stage, and a second irradiation stage which irradiates the laser beam under a second driving condition different from the first driving condition to provide a second portion of the beam irradiation line which corresponds to the second area, after the first rest stage. The irradiating of the laser beam is performed n times (where 'n' is a natural number equal to or greater than 2), and the beam irradiation line provided by irradiating the laser beam n times includes the first portion having a first line width, and the second portion having a rear portion having a second line width different from the first line width, and a boundary portion which connects the first portion to the rear portion and having a third line width smaller than the first line width and larger than the second line width.

The method may further include separating the display device from the work panel by repeatedly performing the irradiating of the laser beam.

The boundary portion may have a length from about 1 micrometer to about 30 micrometers.

The method may further includes a second rest stage and a third irradiation stage, and the work panel may further include a third area having a third stack structure different from the first and second stack structures. The second rest stage may include stopping the driving of the laser beam after the second irradiation stage, and the third irradiation stage may include irradiating the laser beam under a third driving condition different from the first and second driving conditions to provide a third portion of the beam irradiation line which corresponds to the third area, after the second rest stage.

According to one or more embodiment, the driving condition of the laser beam is determined based on the stack structure of a respective area of the display device which is to be separated from the work panel. The laser beam is irradiated to the area having the first stack structure (e.g., larger thickness) at the first driving condition, and the laser beam is irradiated to the second area having the second stack structure (e.g., smaller thickness) at the second driving condition. When the first driving condition is changed to the second driving condition, the laser beam is in the rest stage during which the laser beam is not irradiated. Thus, irradiation of the laser beam to the second stack structure at the first driving condition may be reduced or effectively prevented. Consequently, damage to the planar area of the display device having the second stack structure may be reduced or effectively prevented.

BRIEF DESCRIPTION OF THE DRAWINGS

The above and other advantages of the invention will become readily apparent by reference to the following detailed description when considered in conjunction with the accompanying drawings where.

DETAILED DESCRIPTION

Figure 1:
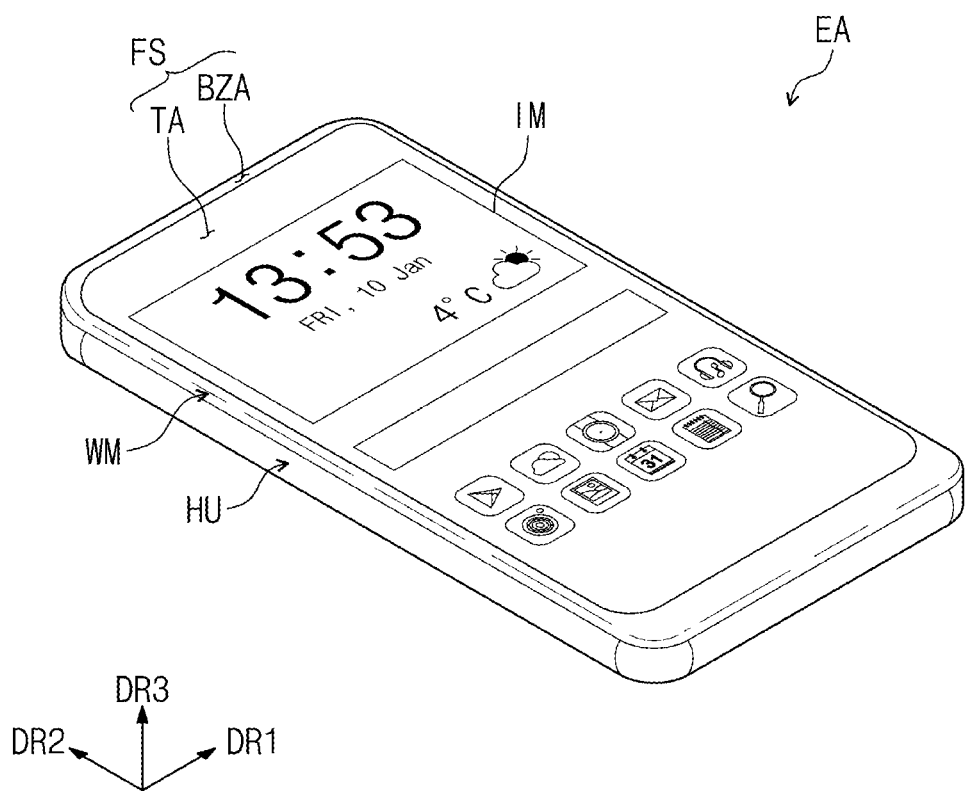
FIG. 1 is a perspective view showing an embodiment of an electronic apparatus.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like numerals refer to like elements throughout. In the drawings, the thickness, ratio, and dimension of components are exaggerated for effective description of the technical content.

It will be understood that when an element or layer is referred to as being related to another element such as being "on," "connected to" or "coupled to" another element or layer, it can be directly on, connected or coupled to the other element or layer or intervening elements or layers may be present. In contrast, when an element or layer is referred to as being related to another element such as being "directly on," "directly connected to" or "directly coupled to" another element or layer, no intervening elements or layers are present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

The terminology used herein is for the purpose of describing particular embodiments only and is not intended to be limiting. As used herein, the singular forms, "a," "an" and "the" are intended to include the plural forms as well, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments will be explained in detail with reference to the accompanying drawings.

Figure 2A:
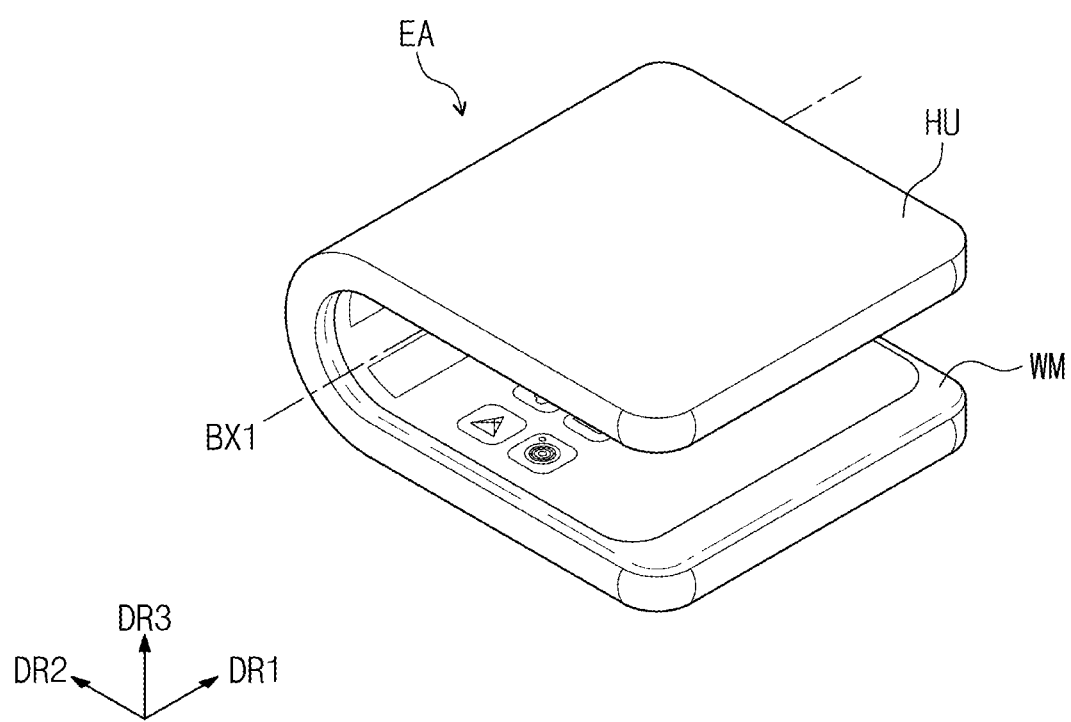
FIG. 2A is a perspective view showing an embodiment of the electronic apparatus in FIG. 1, which is bent.
Figure 2B:
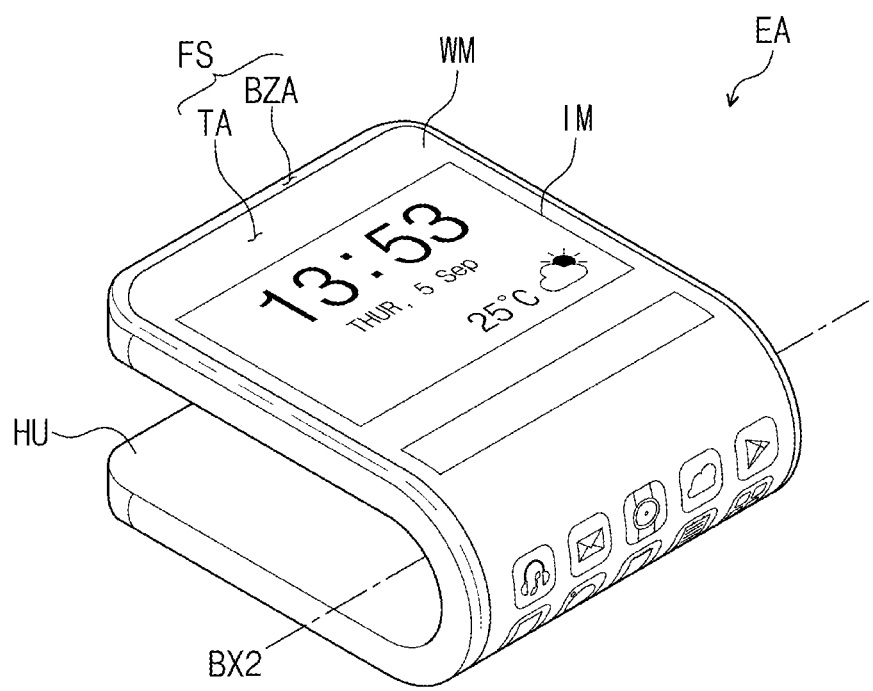
FIG. 2B is a perspective view showing an embodiment of a display device of the electronic apparatus in FIG. 1, which is bent.

FIG. 1 is a perspective view showing an embodiment of an electronic apparatus EA. FIG. 2A is a perspective view showing an embodiment of the electronic apparatus EA in FIG. 1 which is bent to dispose portions of a display area DA facing each other. FIG. 2B is a perspective view showing an embodiment of the electronic apparatus EA in FIG. 1 which is bent to dispose portions of a housing or outer case facing each other. Hereinafter, embodiments will be described with reference to FIGS. 1, 2A and 2B.

The electronic apparatus EA may be an apparatus that is activated in response to electrical signals applied thereto. The electronic apparatus EA may include, for example, a tablet computer, a notebook computer, a computer or a smart television. A smartphone will be hereinafter described as a representative example of the electronic apparatus EA.

The electronic apparatus EA displays an image IM through a transmission area TA. The image IM includes a still image and/or a motion image. FIG. 1 shows a clock widget and application icons as a representative example of the image IM.

The transmission area TA may have a quadrangular shape in a plane substantially parallel to a plane defined by a first direction DR1 and a second direction DR2 crossing each other, however, this is merely exemplary. The transmission area TA may include a variety of planar shapes and should not be particularly limited.

A bezel area BZA is defined adjacent to the transmission area TA. The bezel area BZA may surround the transmission area TA in a plan view (e.g., in a direction normal to the plane defined by the first direction DR1 and the second direction DR2 crossing each other). However, this is merely exemplary, and the bezel area BZA may be defined adjacent to only one side of the transmission area TA or may be omitted. The electronic apparatus EA may include various embodiments and should not be limited to a particular embodiment. The transmission area TA and the bezel area BZA may define a total planar area of a front surface FS (e.g., display surface) of the electronic apparatus EA. Various members, layers, etc. of the electronic apparatus EA may include the transmission area TA and the bezel area BZA corresponding to those described above for the electronic apparatus EA.

The front surface FS may be disposed in a plane substantially parallel to the plane defined by the first direction DR1 and the second direction DR2 crossing each other. A normal line direction to the front surface FS may correspond to a third direction DR3 (hereinafter, also referred to as a "thickness direction") of the electronic apparatus EA. In the embodiment, front (or upper) and rear (or lower) surfaces of the electronic apparatus EA and various members thereof are defined with respect to a direction in which the image IM is displayed. The front and rear surfaces are opposite to each other along the third direction DR3.

Directions indicated by the first, second and third directions DR1, DR2 and DR3 are relative to each other and may be changed to other directions. Hereinafter, the first, second and third directions are respectively indicated by the first, second and third directions DR1, DR2, and DR3 may otherwise be referred to as first, second and third directional axes.

The electronic apparatus EA may have an outer appearance that is defined by a window WM and an external case HU. The front surface FS of the electronic apparatus EA may be defined by portions of the window WM.

Referring to FIGS. 2A and 2B, the electronic apparatus EA may be bendable with respect to one or more bending axis. As shown in FIG. 2A, the electronic apparatus EA may be bendable with respect to a first bending axis BX1. The first bending axis BX1 may be defined at the window WM. Accordingly, the electronic apparatus EA may be bendable such that different portions of the window WM face each other and the external case HU is exposed to outside the electronic apparatus EA which is bent, to define a first mode of the electronic apparatus EA.

As shown in FIG. 2B, the electronic apparatus EA may be bendable with respect to a second bending axis BX2. The second bending axis BX2 may be defined at the external case HU. Therefore, the electronic apparatus EA may be bendable such that different portions of the external case HU face each other and the window WM is exposed to outside the electronic apparatus EA, to define a second mode of the electronic apparatus EA. The image IM displayed by the electronic apparatus EA which is bent as shown in FIG. 2B may be easily viewable from outside the electronic apparatus EA even though the electronic apparatus EA is bent in the second mode thereof.

The first bending axis BX1 and the second bending axis BX2 may be substantially simultaneously present in a same one of the electronic apparatus EA. In this case, the electronic apparatus EA may be changed to the electronic apparatus EA in the first mode or the electronic apparatus EA in the second mode depending on a direction of an external force applied thereto. As another way, the first bending axis BX1 and the second bending axis BX2 may be selectively present in a same one of the electronic apparatus EA. The extension direction of the first bending axis BX1 and the second bending axis BX2 may be defined in various directions without being limited to the first direction DR1 which is shown in FIGS. 2A and 2B, and should not be limited.

The electronic apparatus EA may be bent with respect to one or more of the bending axes BX1 and BX2, however, is not limited thereto. The electronic apparatus EA may be unbendable (e.g., have a rigid characteristic not to be bent and to remain flat), and should not be particularly limited.

Figure 3:
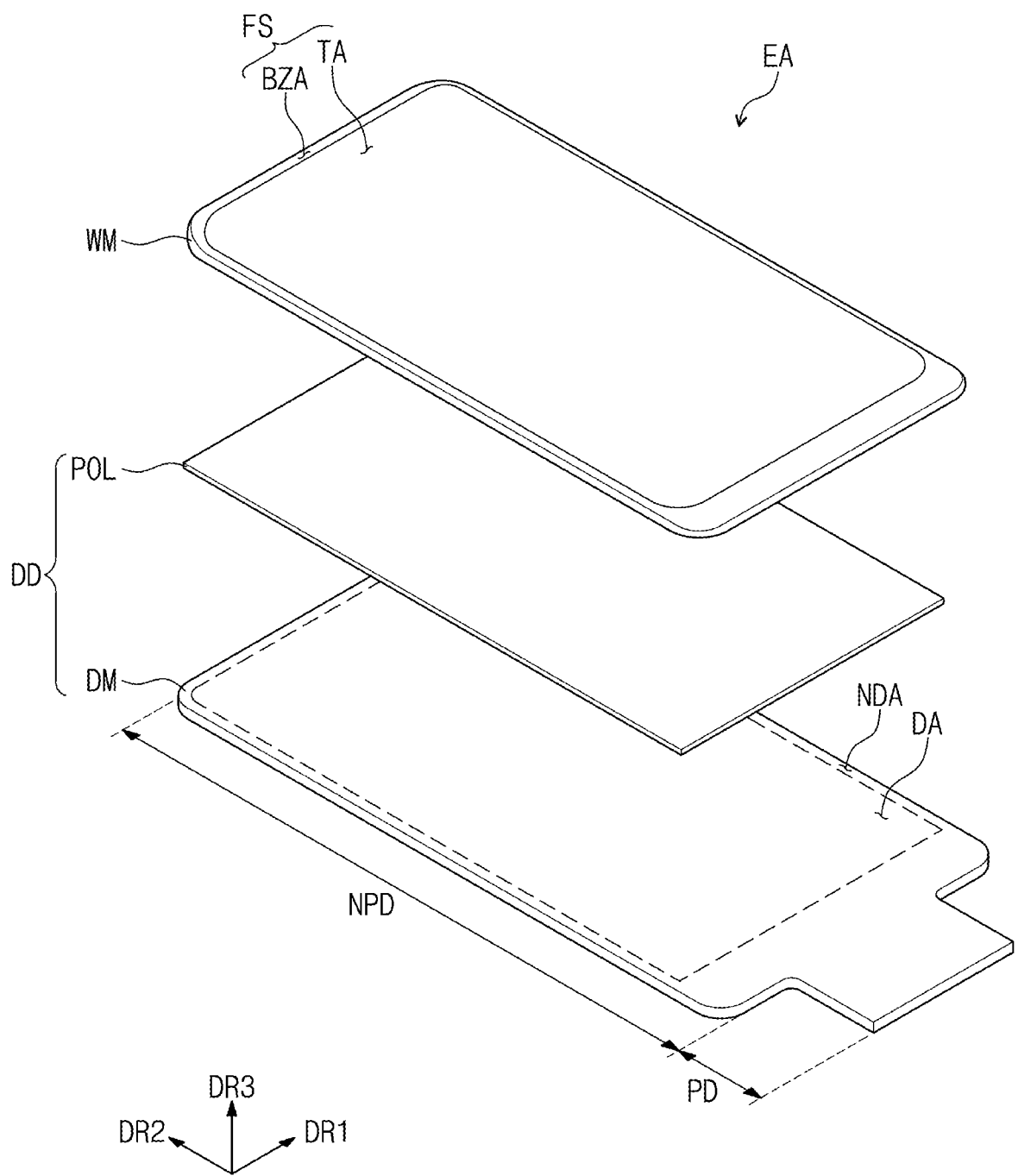
FIG. 3 is an exploded perspective view showing an embodiment of the electronic apparatus in FIG. 1.

FIG. 3 is an exploded perspective view showing an embodiment of the electronic apparatus EA in FIG. 1. Referring to FIG. 3, the electronic apparatus EA includes a display device DD and the window WM. The display device DD includes a polarizing module POL (e.g., polarizing layer) and a display module DM. The window WM, the polarizing module POL and the display module DM are each disposed in a plane which is substantially parallel to a plane defined by the first direction DR1 and the second direction DR2 crossing each other. The window WM, the polarizing module POL and the display module DM may be stacked along the third direction DR3. The window WM, the polarizing module POL and the display module DM may be stacked in order in the third direction DR3.

Figure 4A:
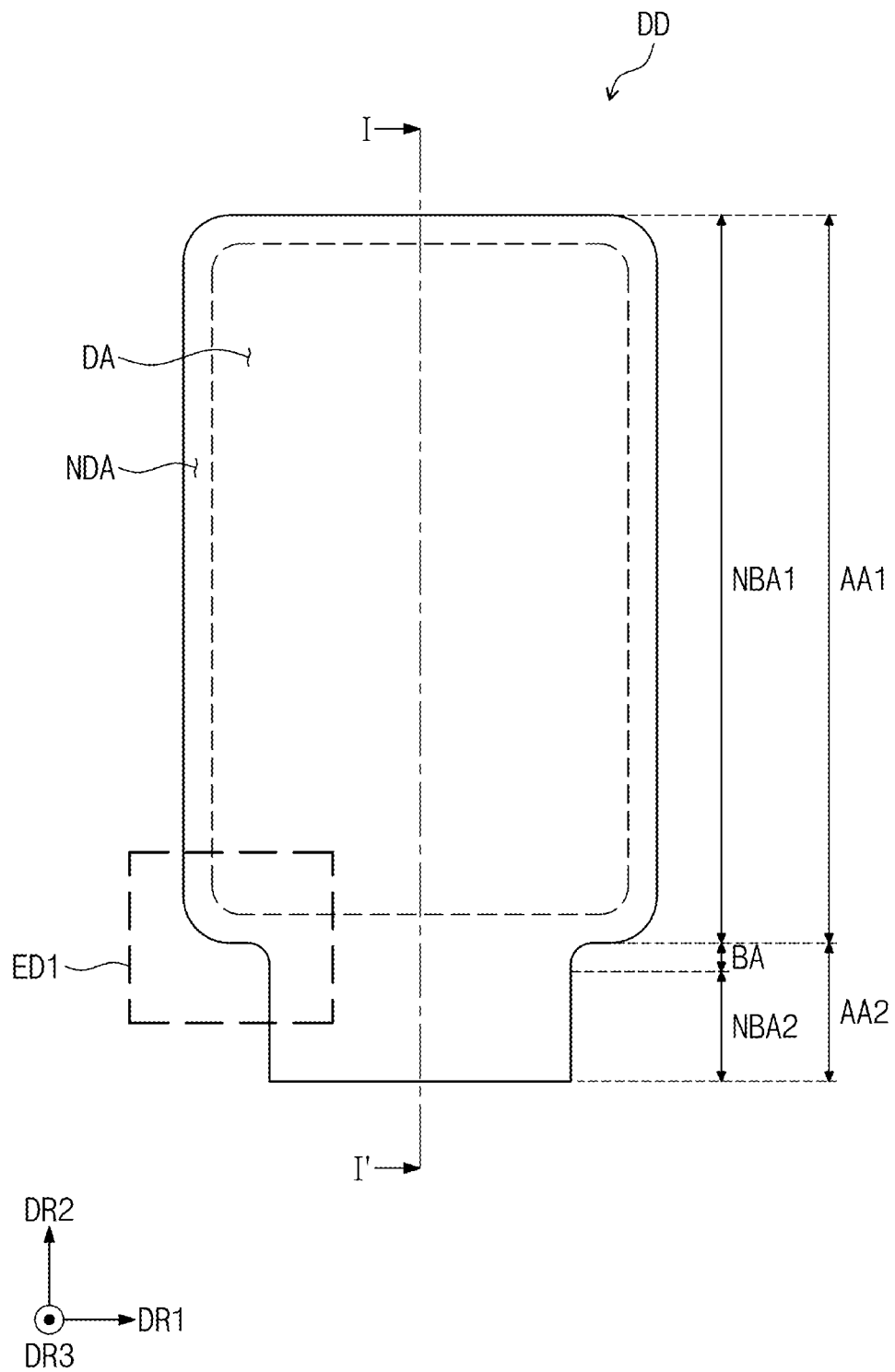
FIG. 4A is a plan view showing an embodiment of a display device in FIG. 3.
Figure 4B:
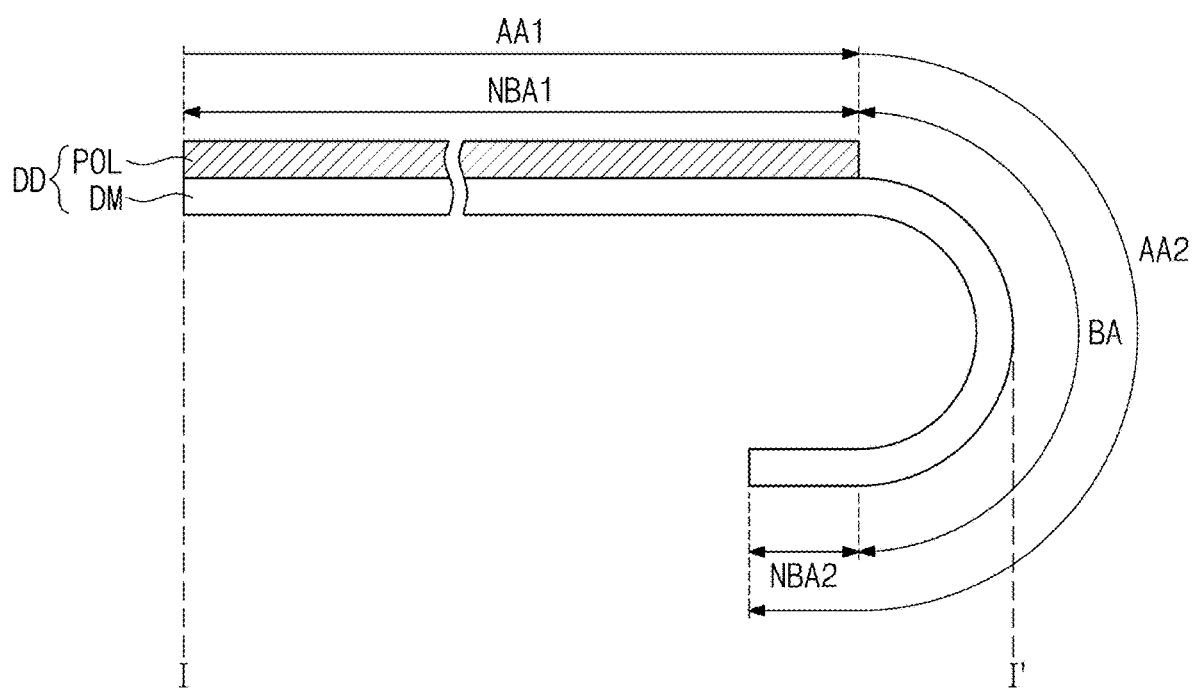
FIG. 4B is a cross-sectional view taken along line I-I' in FIG. 4A.
Figure 4B:
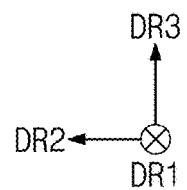
Figure 4C:
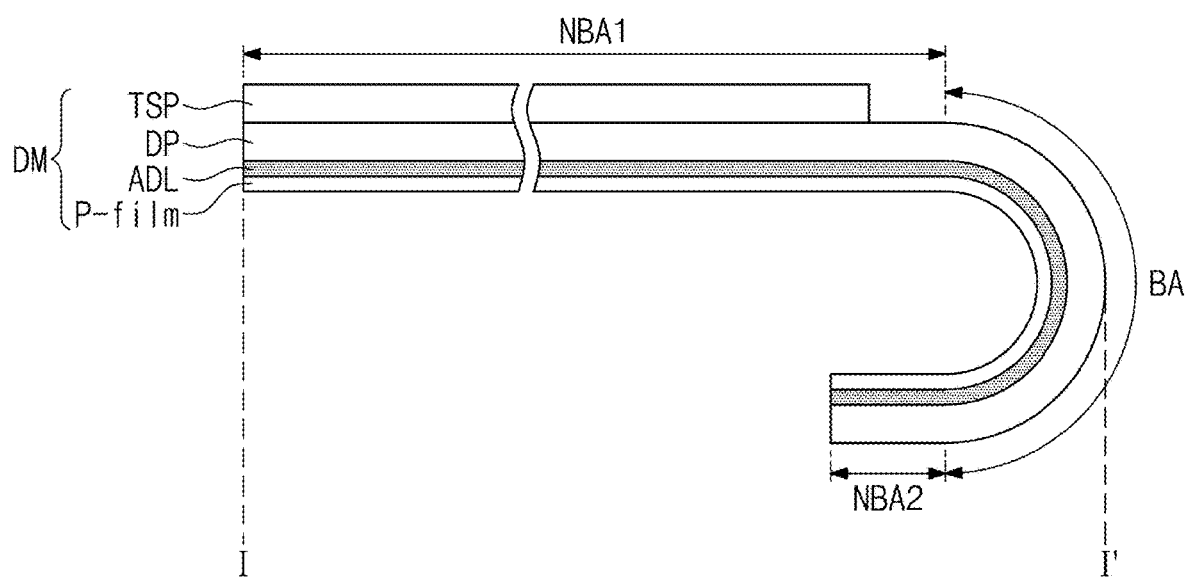
FIG. 4C is a cross-sectional view showing an embodiment of a display module in FIG. 4B.
Figure 4D:
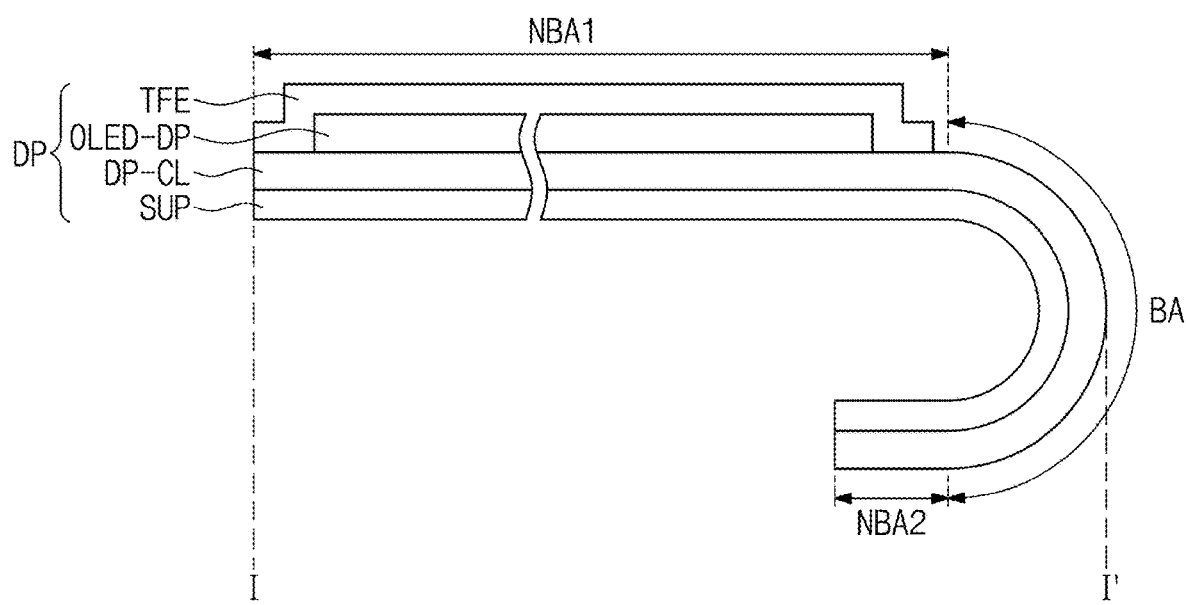
FIG. 4D is a cross-sectional view showing an embodiment of a display panel in FIG. 4C.
Figure 4D:
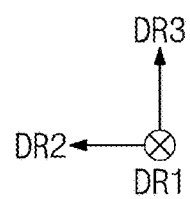
Figure 4E:
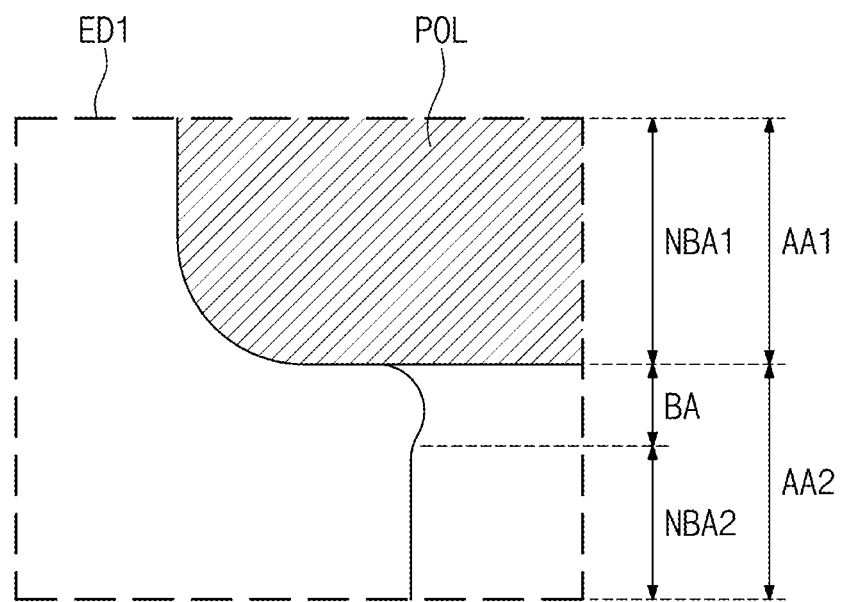
FIG. 4E is an enlarged plan view showing an embodiment of a portion of the display device in FIG. 4A.
Figure 4E:
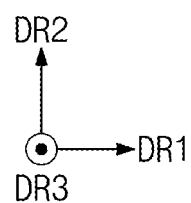

FIG. 4A is a plan view showing an embodiment of the display device DD in FIG. 3. FIG. 4B is a cross-sectional view taken along line I-I' shown in FIG. 4A, in the display device DD which is bent. FIG. 4C is a cross-sectional view showing an embodiment of the display module DM in FIG. 4B, taken along line I-I' shown in FIG. 4A, in the display device DD which is bent. FIG. 4D is a cross-sectional view showing an embodiment of a display panel DP shown in FIG. 4C, taken along line I-I' shown in FIG. 4A, in the display device DD which is bent. FIG. 4E is an enlarged top plan view showing an embodiment of a first region ED1 of the display device DD in FIG. 4A. Hereinafter, the display device DD will be described in detail with reference to FIGS. 4A to 4E.

FIG. 4A is a top plan view showing an embodiment of the display device DD in FIG. 3. The display device DD includes a display area DA and a peripheral area NDA. The image IM is displayed in the display area DA. The peripheral area NDA is covered by the bezel area BZA. That is, the peripheral area NDA corresponds to the bezel area BZA. In an embodiment, the peripheral area NDA may surround the display area DA, however, is not limited thereto. A driving circuit and/or a driving line are arranged in the peripheral area NDA, to be connected to elements in the display area DA and drive the display area DA to display the image IM.

Referring to FIGS. 4A and 4B, the display device DD includes a first area AA1 having a first stack structure in which the polarizing module POL and the display module DM are stacked along the third direction DR3, and a second area AA2 having a second stack structure including the display module DM but excluding the polarizing module POL.

The first area AA1 includes a first non-bending area NBA1 at which the display device DD and/or various layers thereof are not bendable and/or remains flat even where the display device DD is bent The second area AA2 includes a bending area BA at which the display device DD and/or various layers thereof are bendable and a second non-bending area NBA2 at which the display device DD and/or various layers thereof are not bendable and/or remains flat even where the display device DD is bent. The first area AA1 includes the display area DA and a first part of the peripheral area NDA, while the second area AA2 includes only a second part of the peripheral area NDA which excludes the first part thereof. A non-bending area may be provided in plural including the first non-bending area NBA1 and the second non-bending area NBA2 (e.g., non-bending areas NBA1 and NBA2).

FIG. 4B is a cross-sectional view taken along line I-I', in the display device DD which is shown in FIG. 4A which is bent at an end portion of the display device DD. Referring to FIG. 4B, the bending area BA and the non-bending areas NBA1 and NBA2 commonly include the display module DM, and the first non-bending area NBA1 further includes the polarizing module POL. The polarizing module POL and the display module DM are arranged along the third direction DR3. The polarizing module POL reduces a reflectance of an external light incident to the display device DD from outside of the window WM. The display module DM generates the image IM and displays the image IM through the display area DA of the display device DD.

FIG. 4C is a cross-sectional view showing the display module DM included in the display device DD in FIG. 4B, which is bent. Referring to FIG. 4C, the display module DM includes an input sensor TSP (e.g., input sensor layer), the display panel DP, an adhesive layer ADL, and a protective film P-film (e.g., protective layer). The input sensor TSP, the display panel DP, the adhesive layer ADL and the protective film P-film are arranged along the third direction DR3. The input sensor TSP, the display panel DP, the adhesive layer ADL and the protective film P-film are arranged in order in a direction away from the polarizing module POL, along the third direction DR3. Taking FIGS. 4A, 4B and 4C together, the input sensor TSP may be disposed in the display area DA of the display device DD, without being limited thereto.

In the embodiment, a difference in thicknesses due to the layers in the stack structure of the display module DM is small compared to a thickness deviation caused by the presence or absence of the polarizing module POL in the display device DD. Thus, the thickness difference due to the difference in thicknesses due to the layers in the stack structure within the display module DM is ignored for purposes of explanation.

FIG. 4D is a cross-sectional view showing the display panel DP included in the display module DM in FIG. 4C, which is bent. Referring to FIG. 4D, the display panel DP includes an encapsulation layer TFE, a display element layer including an organic light emitting layer OLED-DP, a circuit element layer DP-CL and a support layer SUP. The encapsulation layer TFE, the organic light emitting layer OLED-DP, the circuit element layer DP-CL and the support layer SUP are stacked along the third direction DR3. The encapsulation layer TFE, the organic light emitting layer OLED-DP, the circuit element layer DP-CL and the support layer SUP are stacked in order in a direction away from the polarizing module POL, along the third direction DR3. Taking FIGS. 4A, 4B and 4C together, the organic light emitting layer OLED-DP (e.g., display element layer) may be disposed in the display area DA of the display device DD, without being limited thereto.

In the embodiment, the difference in thicknesses due to the difference in layers of the stack structure of the display panel DP is small compared to the thickness deviation caused by the presence or absence of the polarizing module POL (e.g., polarizing layer or polarizing film) in the display device DD. Thus, the thickness difference due to the difference in thicknesses due to the layers in the stack structure within the display panel DP is ignored for purposes of explanation.

Referring to FIGS. 4A and 4B, the display device DD includes the bending area BA and the non-bending areas NBA1 and NBA2. The bending area BA is defined between the first non-bending area NBA1 and the second non-bending area NBA2, in a direction along the display module DM and/or a direction along the display panel DP. The position and the number of the bending areas should not be particularly limited to that shown in FIG. 4A.

FIG. 4E is an enlarged view showing the first region ED1 of the display device DD in FIG. 4A. Referring to FIG. 4E, the first and second non-bending areas NBA1 and NBA2 and the bending area BA of the display device DD each include portions of the display module DM. The first non-bending area NBA1 of the display device DD further includes the polarizing module POL. In the top plan view, an outer edge of the display device DD at the bending area BA defines a curved line or an outer edge which is curved.

Figure 5A:
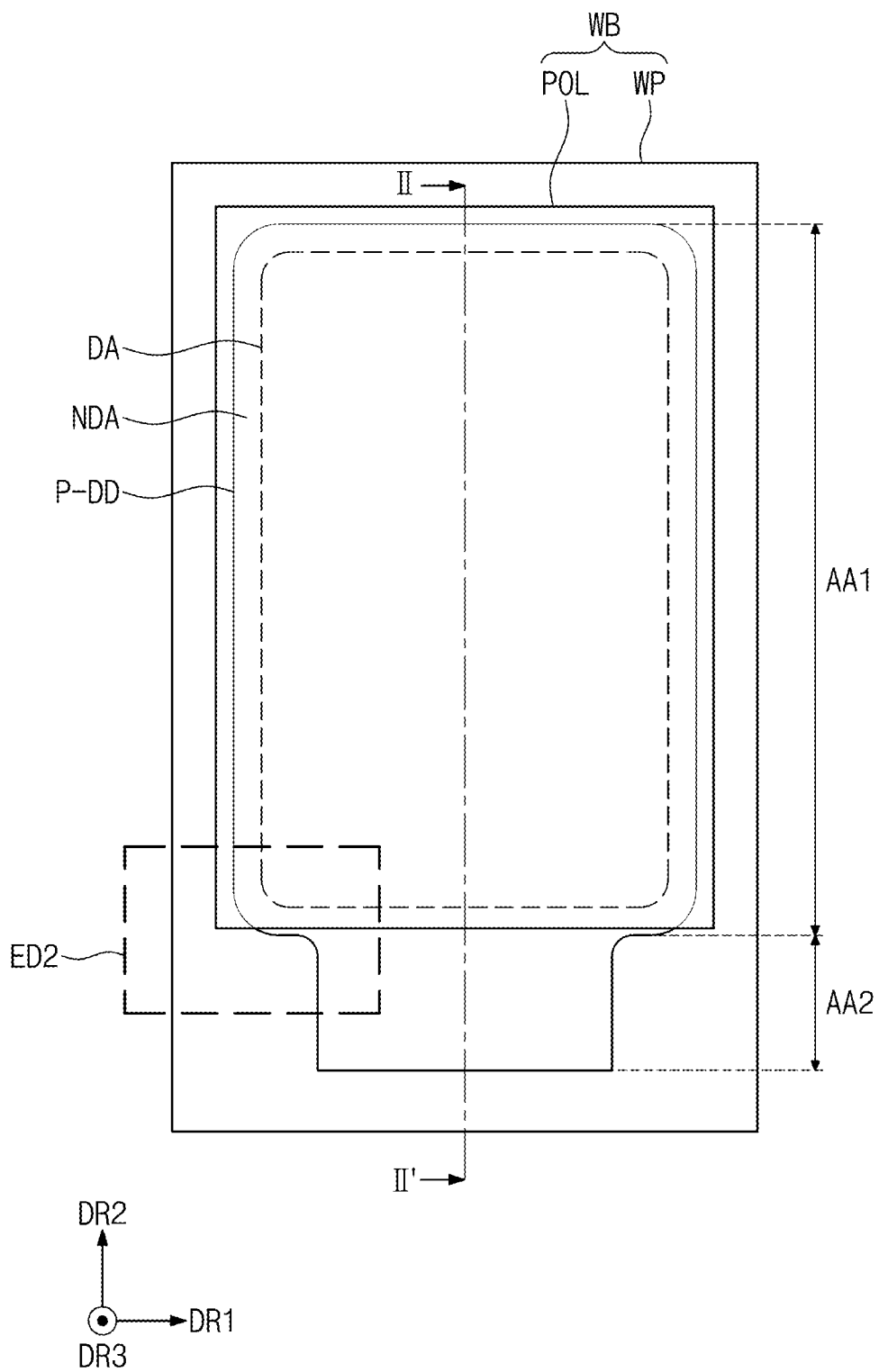
FIG. 5A is a plan view showing an embodiment of a work panel including a display device area.
Figure 5B:
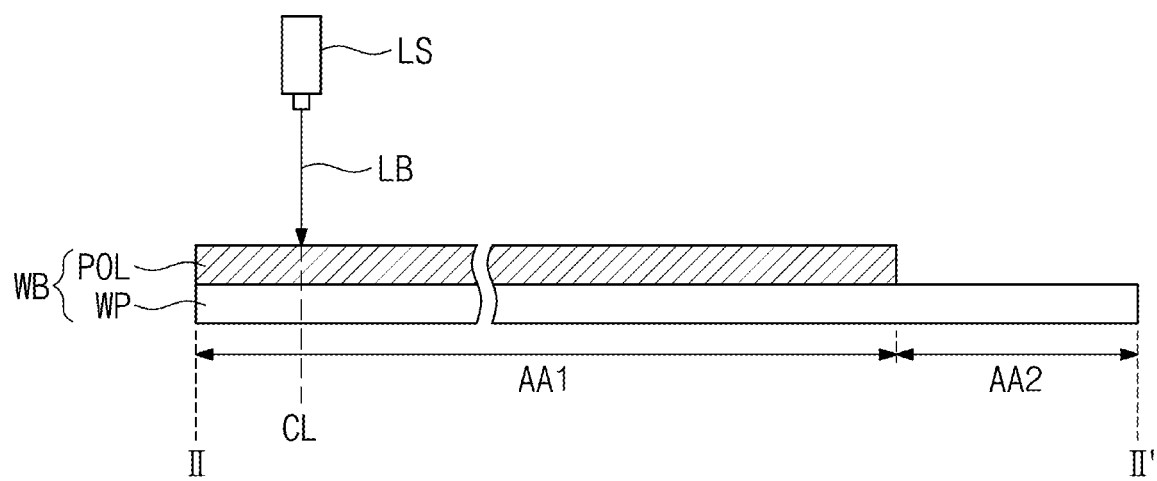
FIG. 5B is a cross-sectional view showing an embodiment of a process in a method of manufacturing the display device of FIG. 5A.
Figure 5C:
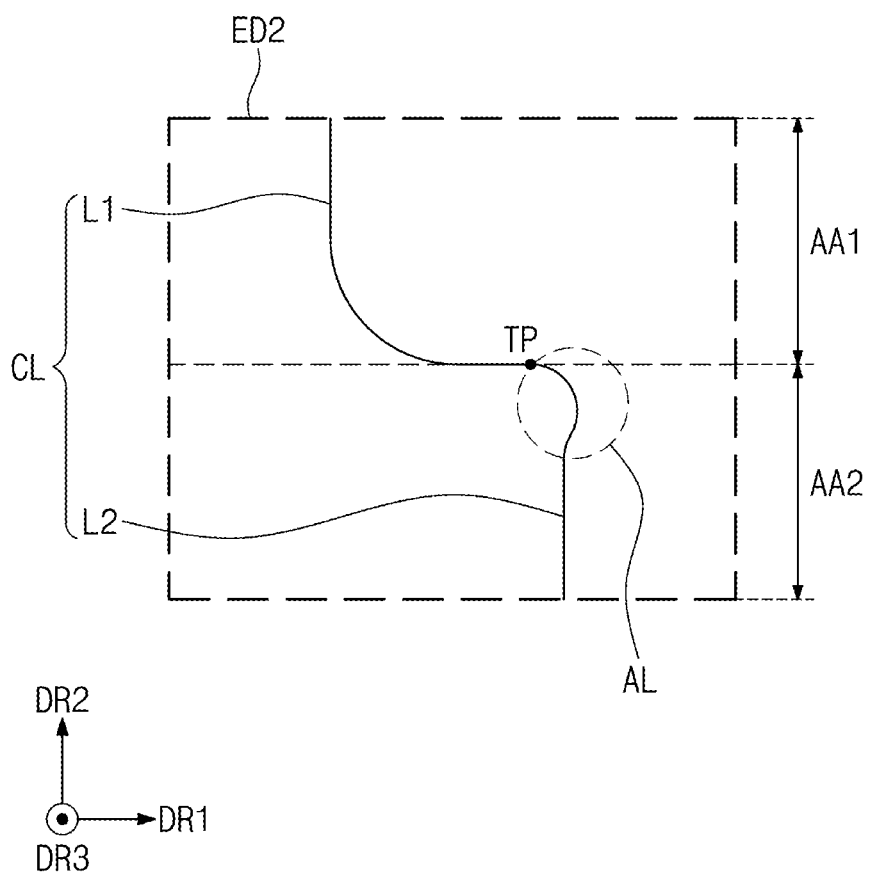
FIG. 5C is an enlarged plan view showing an embodiment of a portion of the display device of FIG. 5A.
Figure 5D:
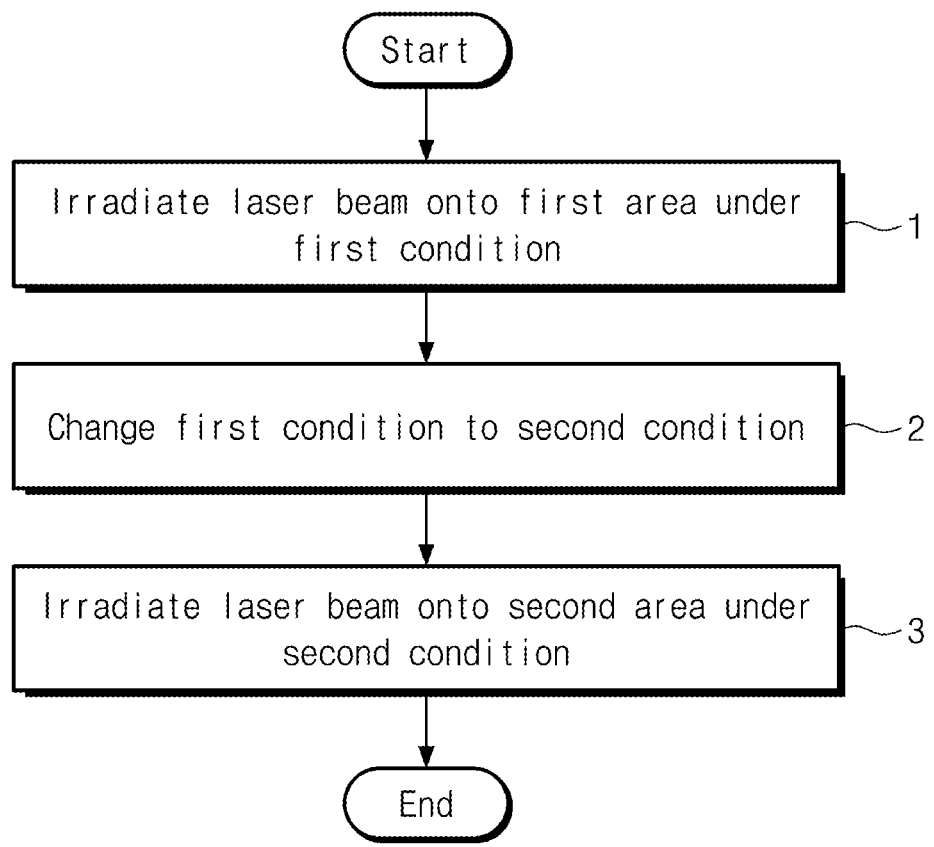
FIG. 5D is a flowchart showing an embodiment of a method of manufacturing the display device.
Figure 5E:
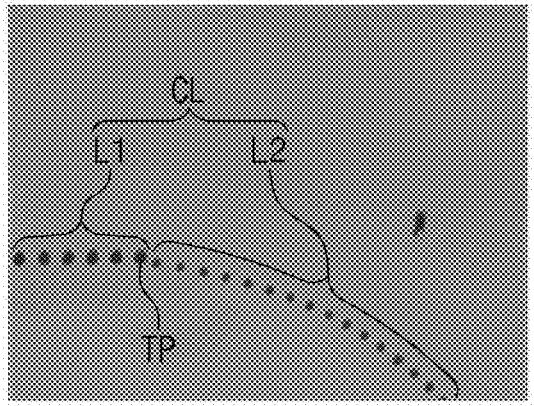
FIG. 5E is an image of an embodiment of a first laser irradiation line.
Figure 5F:
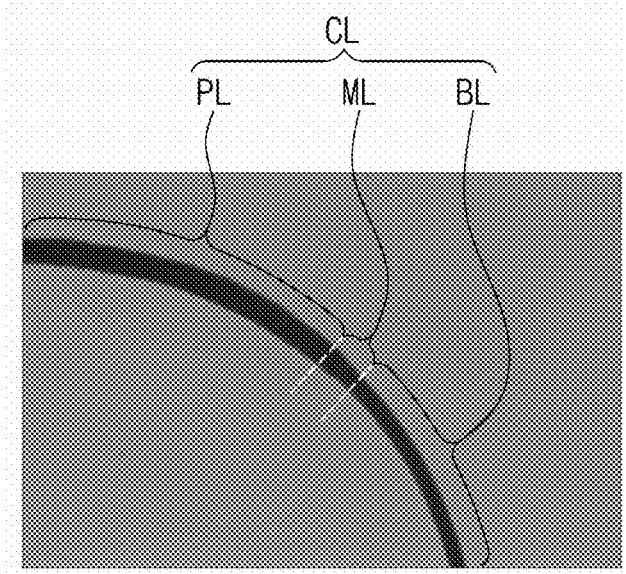
FIG. 5F is an image of a second laser irradiation line.
Figure 5G:
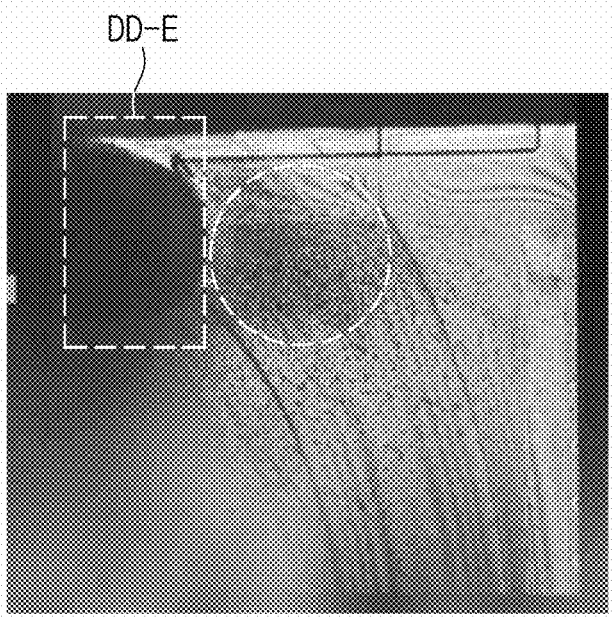
FIG. 5G is a scanning electron microscope ("SEM") image showing a comparative display device.
Figure 5H:
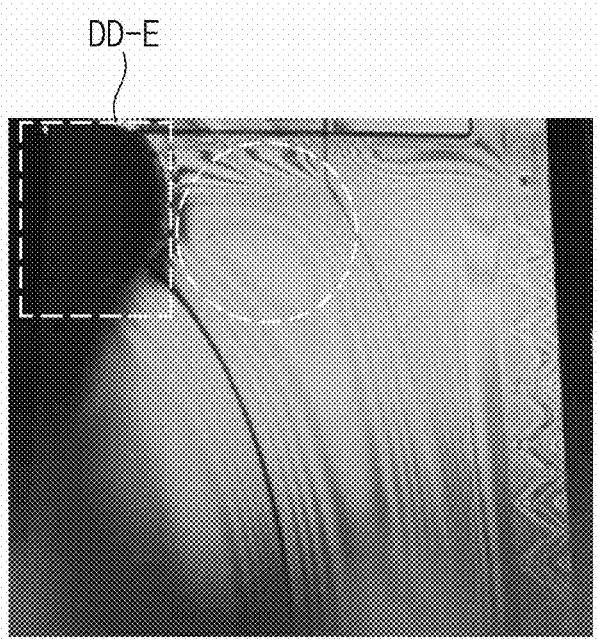
FIG. 5H is a SEM image showing an embodiment of a display device.

FIG. 5A is a plan view showing an embodiment of a work panel WB (e.g., preliminary display device) including a display device area P-DD which corresponds to a planar area of the display device DD (see FIG. 4A). FIG. 5B is a cross-sectional view showing an embodiment of a process in a method of manufacturing the display device DD of FIG. 5A. FIG. 5C is an enlarged plan view showing an embodiment of a second region ED2 of the work panel WB of FIG. 5A. FIG. 5D is a flowchart showing an embodiment of a method of manufacturing the display device DD. FIG. 5E is a picture of an embodiment of a first laser irradiation line. FIG. 5F is a picture of an embodiment of a second laser irradiation line. FIG. 5G is a scanning electron microscope ("SEM") image showing a comparative display device. FIG. 5H is a SEM image showing an embodiment of the display device DD. Hereinafter, an embodiment of a manufacturing method of the display device DD will be described in detail with reference to FIGS. 5A to 5H.

In FIGS. 5A to 5H, the same/similar reference numerals denote the same/similar elements in FIGS. 1 to 4E, and thus, detailed descriptions of the same elements will be omitted.

An embodiment of a manufacturing method of a display device DD includes providing the work panel WB as a preliminary display device. Referring to FIGS. 5A and 5B, the work panel WB includes the first area AA1 having the first stack structure and the second area AA2 having the second stack structure which is different from the first stack structure. In an embodiment, the preliminary display device includes a first area AA1 including a first stack structure of the display device DD, the first area AA1 having a first thickness, and a second area AA2 including a second stack structure of the display device DD which is different from the first stack structure and has a second thickness smaller than the first thickness The work panel WB includes a work display module WP (e.g., preliminary display module) and the polarizing module POL in a preliminary form which is disposed on the work display module WP. Each of the work display module WP and the polarizing module POL which is in the preliminary form extends further than the display device area P-DD. Each of the work display module WP and the polarizing module POL which is in the preliminary form defines an extended portion outside of the display device area P-DD. The extended portion extends in a direction away from the display device area P-DD.

The work panel WB includes the first area AA1 and the second area AA2. The first area AA1 corresponds to an area that overlaps the polarizing module POL. The second area AA2 corresponds to an area where the work display module WP is exposed from the polarizing module POL without being covered by the polarizing module POL. That is, the preliminary display device includes the display panel DP which displays an image IM, the display panel DP in both the first stack structure of the first area AA1 and the second stack structure of the second area AA2, a polarizing layer facing the display panel DP, the polarizing layer in the first stack structure of the first area AA1 and excluded from the second stack structure of the second area AA2, and a protective layer facing the polarizing layer with the display panel DP therebetween, the protective layer in both the first stack structure of the first area AA1 and the second stack structure of the second area AA2.

An embodiment of the manufacturing method of the display device DD includes irradiating a laser beam LB onto the work panel WB using a laser unit LS as shown in FIG. 5B. A beam irradiation line CL (e.g., cutting line) is formed in the work panel WB. In the plan view, the beam irradiation line CL has a shape corresponding to an outer edge of the display device area P-DD which is shown in FIG. 5A. The display device area P-DD includes a portion of the first area AA1 and a portion of the second area AA2. An outer edge of the display device area P-DD (FIG. 5A) corresponds to an outer edge of the display device DD (FIG. 4A).

FIG. 5C is an enlarged view showing a portion of the beam irradiation line CL. The beam irradiation line CL includes a first portion L1 corresponding to the outer edge of the display device DD at the first area AA1 and a second portion L2 corresponding to the outer edge of the display device DD at the second area AA2. Referring to FIG. 5A, a portion of the outer edge of the display device area P-DD, which overlaps the polarizing module POL, corresponds to the first portion L1. A portion of the outer edge of the display device area P-DD, which does not overlap the polarizing module POL, corresponds to the second portion L2.

In the embodiment, the second portion L2 includes a curved portion having a curved shape. A boundary portion AL which is closest to and extended from the first portion L1 may have the curved shape. The boundary portion AL corresponds to a portion of the second portion L2.

In the embodiment, the beam irradiation line CL is described as being a closed line shape corresponding to the outer edge of the display device area P-DD, however, should not be limited thereto or thereby. The beam irradiation line CL may include a portion with the closed line shape and a portion with an open line shape. According to another embodiment, the beam irradiation line CL may include only the open line shape.

Hereinafter, an embodiment of a method of irradiating the laser beam LB will be described in more detail. Referring to FIGS. 5C and 5D, the laser beam LB is irradiated onto the work panel WB at the first area AA1 using the laser unit LS in a first driving condition of the laser unit LS (hereinafter, referred to as a "first irradiation process (1)"). After the first irradiation process (1), the driving of the laser beam LB is stopped, and the driving condition of the laser unit LS is changed to a first rest condition (hereinafter, referred to as a "first rest process (2)"). After the first rest process (2), the laser beam LB is irradiated onto the work panel WB at the second area AA2 using the laser unit LS in a second driving condition of the laser unit LS (hereinafter, referred to as a "second irradiation process (3)").

The driving condition of the laser unit LS is determined by frequency, power and moving speed of the laser beam LB. A luminous flux is determined according to the driving condition. The luminous flux is controlled by modifying at least one of the frequency, the power and the moving speed.

In the embodiment, the first driving condition and the second driving condition of the laser unit LS have substantially the same frequency and the same moving speed, and have different powers from each other. The frequency is in a range from about 100 kilohertz (kHz) to about 1800 kHz, the power is in a range from about 10 watts (W) to about 30 W, and the moving speed is in a range from about 200 millimeters per second (mm/s) to about 5000 mm/s. In the embodiment, the first driving condition and the second driving condition includes any one of the frequency, the power and the moving speed being different from remaining ones of the frequency, the power and the moving speed. Consequently, the laser beam LB having different luminous fluxes may be irradiated depending on the stack structure of the work panel WB.

In the embodiment, the irradiating of the laser beam LB may include maintaining the first rest process (2) for a period from about 1 microseconds to about 500 microseconds. In an embodiment, the first rest process (2) is maintained for a period from about 50 microseconds to about 200 microseconds.

FIG. 5E shows a portion of the beam irradiation line CL at which the laser beam LB is irradiated one time. Since the laser beam LB having a predetermined frequency is irradiated while the laser unit LS moves (except for the first rest process (2)), a plurality of laser spots together forms the beam irradiation line CL. Since the luminous flux of the laser beam LB which is irradiated onto the first portion L1 of the beam irradiation line CL is greater than the luminous flux of the laser beam LB irradiated onto the second portion L2 of the beam irradiation line CL, a dimension of the laser spot of the first portion L1 is greater than a dimension of the laser spot of the second portion L2. The dimension of the laser spot may include a diameter, but is not limited thereto.

FIG. 5E shows a transition spot TP at which the first rest process (2) is performed. The laser spot of the first portion L1 which is closest to the second portion L2 among the laser spots of the first portion L1 may define the transition spot TP. In an embodiment, the preliminary display device may further include a transition spot TP along the outer edge of the display device DD where the first area AA1 having the first thickness and the second area AA2 having the second thickness meet each other, and the irradiating of the laser beam LB further includes performing the first rest process (2) at the transition spot TP.

FIG. 5F shows a portion of a beam irradiation line CL at which the laser beam LB is irradiated n times (where 'n' is a natural number equal to or greater than 2). The laser beam LB is irradiated n times along the outer edge of the display device area P-DD which is shown in FIG. 5A. The expression "laser beam LB is irradiated one time" means that the laser beam LB is irradiated one time along the outer edge of the display device area P-DD. In an embodiment, the expression "laser beam LB is irradiated one time" means that the laser beam LB is irradiated one time along an entirety of the outer edge of the display device area P-DD. The irradiation operation of the laser beam LB described with reference to FIG. 5D is repeated the n times.

The beam irradiation line CL which is provided by the irradiation operation of the laser beam LB described with reference to FIG. 5D and repeated n times includes a front area PL (e.g., front portion) having a first line width, a rear area BL (e.g., rear portion) having a second line width different from the first line width, and a boundary area ML having a third line width different from the first and second line widths and connecting the front area PL and the rear area BL to each other.

In an embodiment, each of the first portion L1 and the second portion L2 of the beam irradiation line CL has a line width. The manufacturing method may include repeating the first irradiation process (1), the first rest process (2) and the second irradiation process (3) for n times (where 'n' is a natural number equal to or greater than 2) to provide the line width of the first portion L1 of the beam irradiation line CL which is different from the line width of the second portion L2 of the beam irradiation line CL. That is, each of the first irradiation process (1), the first rest process (2) and the second irradiation process (3) may be performed n times (where 'n' is a natural number equal to or greater than 2), to provide the beam irradiation line CL having a plurality of line widths. In an embodiment, the second portion L2 of the beam irradiation line CL may include the rear portion having a second line width different from the first line width, and a boundary portion AL which connects the first portion L1 to the rear portion, the boundary portion AL having a third line width which is smaller than the first line width and larger than the second line width.

A length of the beam irradiation line CL is defined along the outer edge of the display device area P-DD. The boundary area ML has a length from about 1 micrometer to about 30 micrometers along the outer edge of the display device area P-DD.

When the laser beam LB is irradiated n times, defects occur at a position corresponding to the transition spot TP, and the boundary area ML is generated. However, since the first rest process (2) is performed for every n cycles during the irradiation of the laser beam LB, the boundary area ML is minimized.

The display device area P-DD is separated from a remainder of the work panel WB along the beam irradiation line CL. That is, the manufacturing method may include irradiating the laser beam LB along the beam irradiation line CL to separate the display device DD from the preliminary display device at the beam irradiation line CL. The remainder of the work panel WB may include an extended portion of the work display module WP and an extended portion of the polarizing module POL in the preliminary form. That is, the display device DD includes the work panel WB from which the extended portions of the work display module WP and the polarizing module POL in the preliminary form are removed.

FIG. 5G shows a comparative display device manufactured by a comparative manufacturing method, and FIG. 5H shows the display device DD manufactured by an embodiment of the manufacturing method. The display device DD which is shown in FIGS. 5G and 5H is the display device area P-DD which is separated from a remainder of the work panel WB by a respective manufacturing method.

A comparative manufacturing method changes the driving condition of the laser beam LB and irradiates the laser beam LB while moving the laser unit LS without a rest process in providing the beam irradiation line CL along the work panel WB. In the comparative manufacturing method, the laser beam LB of the first driving condition overlaps the laser beam LB of the second driving condition at a boundary portion AL between the first portion L1 and the second portion L2. Thus, particles and cracks are generated adjacent to an edge DD-E of the display device.

In the comparative manufacturing method, for instance, when the laser beam LB is irradiated at the second portion L2 corresponding to the second stack structure which is thinner (e.g., as excluding the polarizing module POL in the preliminary form) than the first stack structure (e.g., as including the polarizing module POL in the preliminary form) after the laser unit LS (refer to FIG. 5B) is set to be suitable for the first portion L1 having the first stack structure, the laser beam LB with excessive luminous flux causes the particles or cracks in the second portion L2. In FIG. 5G;

the results caused by the laser beam LB with the excessive luminous flux are shown inside a circle with dotted line.

In contrast, referring to FIG. 5H, particles and cracks are not generated in the area adjacent to the edge DD-E of the display device DD. According to one or more embodiment of the manufacturing method described above, the particles and cracks are not generated since the boundary area ML described with reference to FIG. 5F is minimized and the number of irradiations of the laser beam LB with excessive luminous flux is minimized.

Figure 6A:
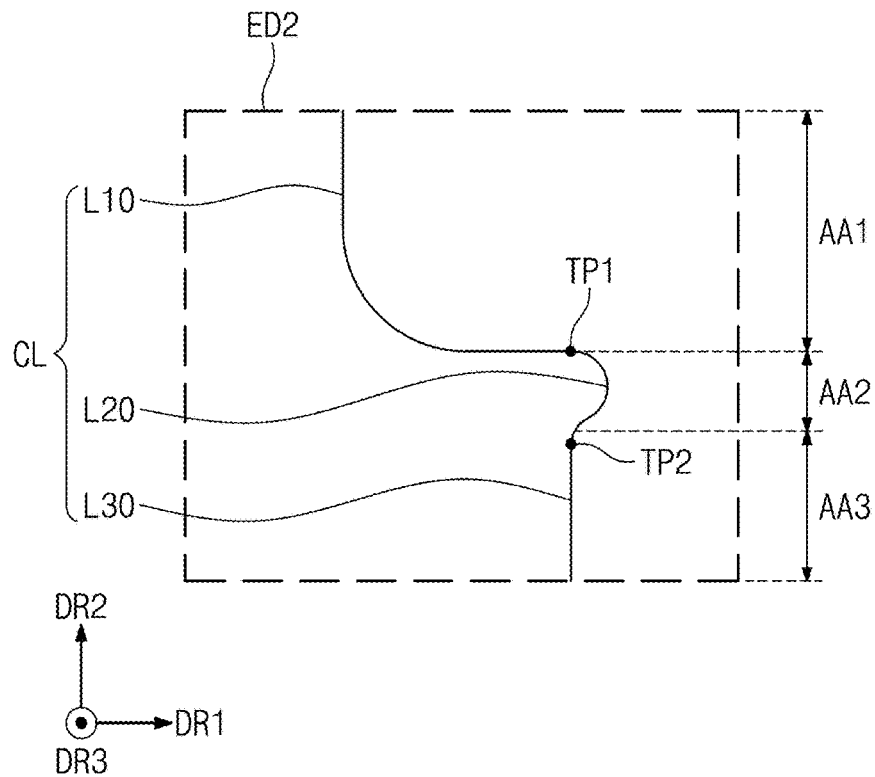
FIG. 6A is an enlarged plan view showing an embodiment of a portion of a display device.
Figure 6B:
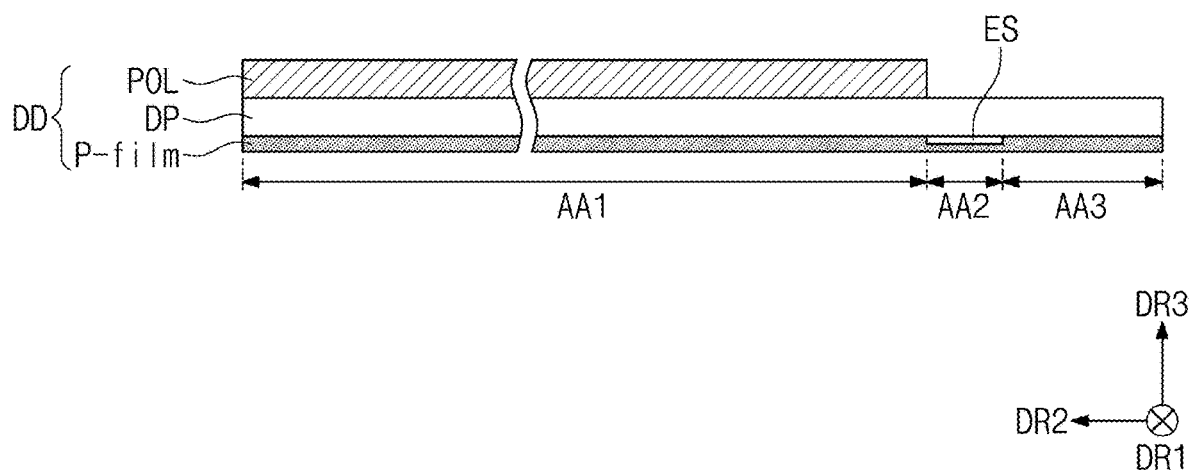
FIG. 6B is a cross-sectional view showing an embodiment of a display device.
Figure 6C:
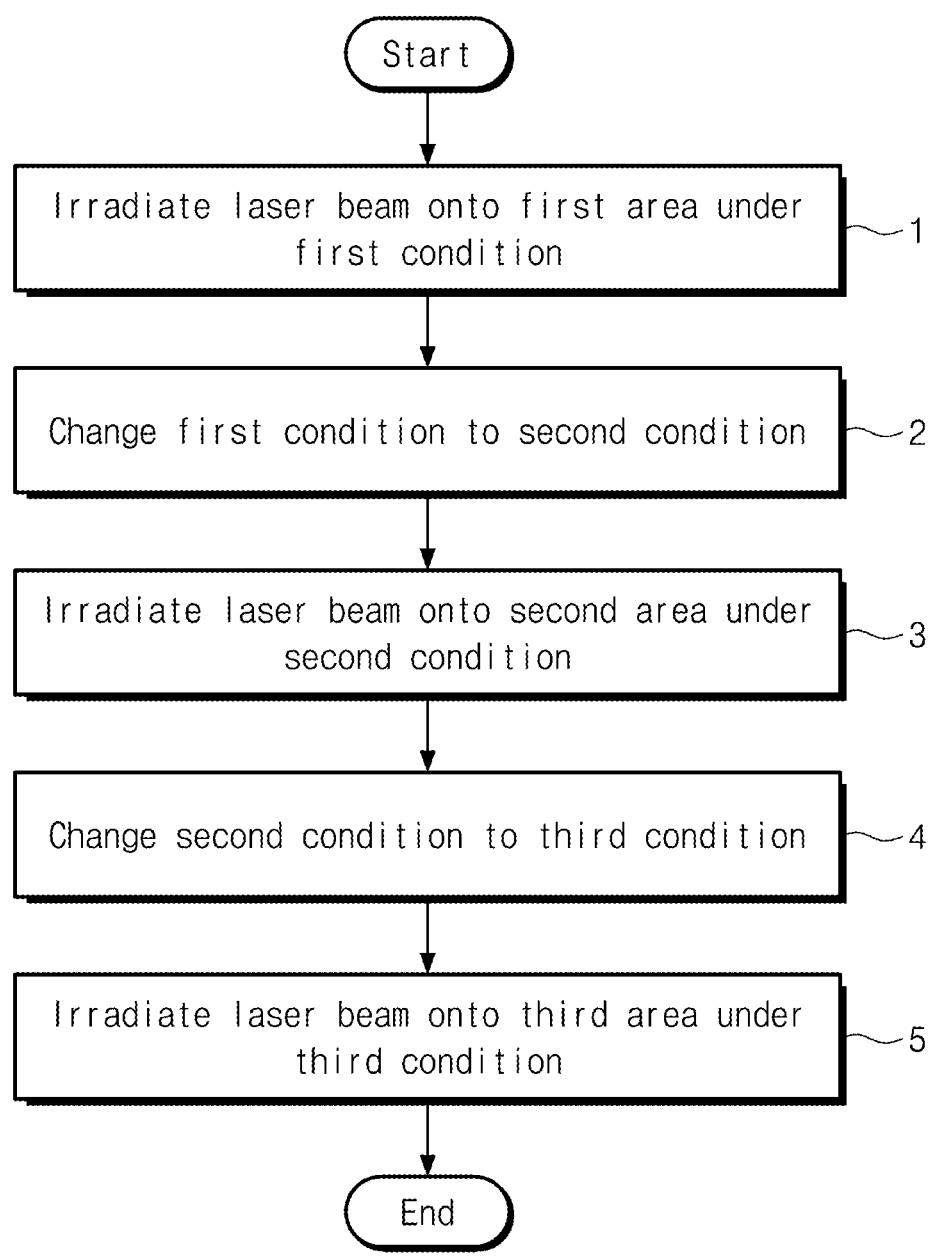
FIG. 6C is a flowchart showing an embodiment of a method of manufacturing a display device.
Figure 7:
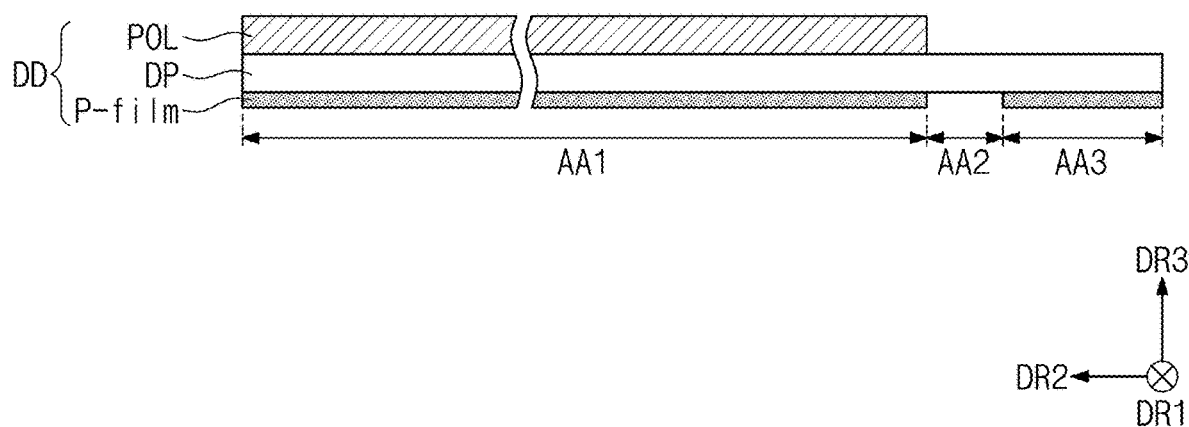
FIG. 7 is a cross-sectional view showing an embodiment of a display device.

FIG. 6A is an enlarged view showing an embodiment of a second region ED2 of a display device DD. FIG. 6B is a cross-sectional view showing an embodiment of a display device DD. FIG. 6C is a flowchart showing an embodiment of a method of manufacturing a display device DD. FIG. 7 is a cross-sectional view showing an embodiment of a display device DD. Hereinafter, the manufacturing method of the display device DD will be described in detail with reference to FIGS. 6A to 6C and 7. In FIGS. 6A to 6C and 7, the same/similar reference numerals denote the same/similar elements, and thus, detailed descriptions of the same elements will be omitted. For convenience of explanation, the input sensor TSP and the adhesive layer ADL which are shown in FIG. 4C are omitted in FIGS. 6A to 6C and 7.

Referring to FIG. 6A, a work panel WB (refer to FIG. 5A) includes a first area AA1 having a first stack structure, a second area AA2 having a second stack structure different from the first stack structure, and a third area AA3 having a third stack structure different from the first and second stack structures. The first area AA1, the second area AA2 and the third area AA3 are disposed in order along the second direction DR2.

The first area AA1 is an area of the display device DD that overlaps the polarizing module POL. The second area AA2 is an area of the display device DD that is not covered by the polarizing module POL and that overlaps a portion of the protective film P-film in which an empty area ES (e.g., reduced-thickness portion) is defined. The third area AA3 is an area of the display device DD that is not covered by the polarizing module POL and that overlaps a full-thickness portion of the protective film P-film in which the empty area ES is not defined. The empty area ES may be a groove in the protective film P-film. That is, the preliminary display device further includes a third area AA3 including a third stack structure which is different from the first stack structure and the second stack structure and has a third thickness smaller than the first thickness, each of the display panel DP and the protective layer is further in the third stack structure of the third area AA3, and at the second area AA2, a groove is defined in the protective layer.

Referring to FIG. 7, the second area AA2 may be an area of the display device DD that is not covered by the polarizing module POL and excludes the protective film P-film. That is, a thickness of the protective film P-film may be minimal at the second area AA2 as compared to a thickness of the protective film P-film at a remainder of the areas.

In an embodiment, a method of providing the beam irradiation line CL is substantially the same as that described with reference to FIG. 5B, and thus, details thereof will be omitted.

FIGS. 6A and 6B are enlarged top plan views showing an embodiment of a portion of the beam irradiation line CL of the work panel WB used in a method of manufacturing a display device DD. The beam irradiation line CL includes a third portion L10 corresponding to the first area AA1, a fourth portion L20 corresponding to the second area AA2, and a fifth portion L30 corresponding to the third area AA3.

A portion of the outer edge of the display device area P-DD (refer to FIG. 5A) which corresponds to the polarizing module POL is the third portion L10, a portion of the outer edge of the display device area P-DD which does not overlap the polarizing module POL and overlaps the protective film P-film including the empty area ES is the fourth portion L20, and a portion of the outer edge of the display device area P-DD which does not overlap the polarizing module POL and overlaps the protective film P-film is the fifth portion L30. The empty area ES is defined at an area in which a groove of the protective film P-film extends to the display panel DP and exposes a surface thereof to outside the protective film P-film.

Referring to FIG. 7, a fourth portion L20 (refer to FIG. 6B) corresponds to a portion of the outer edge of the display device area P-DD which does not overlap the polarizing module POL and the protective film P-film.

Hereinafter, the method of irradiating the laser beam LB to the work panel WB illustrated in FIGS. 6B and 6C will be described in detail.

Referring to FIGS. 6A and 6C, the laser beam LB is irradiated onto the work panel WB at the first area AA1 using a laser unit LS in a first driving condition thereof (hereinafter, referred to as a "first irradiation process (1)"). After the first irradiation process (1), the driving of the laser beam LB is stopped, and then the driving condition of the laser unit LS is changed (hereinafter, referred to as a "first rest process (2)"). After the first rest process (2), the laser beam LB is irradiated onto the work panel WB at the second area AA2 using the laser unit LS in a second driving condition thereof (hereinafter, referred to as a "second irradiation process (3)"). After the second irradiation process (3), the driving of the laser beam LB is stopped, and then the driving condition of the laser unit LS is changed (hereinafter, referred to as a "second rest process (4)"). After the second rest process (4), the laser beam LB is irradiated onto the work panel WB at the third area AA3 using the laser unit LS in a third driving condition (hereinafter, referred to as a "third irradiation process (5)").

In the embodiment, the first irradiation process (1), the first rest process (2) and the second irradiation process (3) are substantially the same as those described with reference to FIGS. 5A and 5E, and repeated description is omitted. Thus, the second rest process (4) and the third irradiation process (5) will be described in detail.

FIG. 6A shows a first transition spot TP1 which corresponds to the transition spot TP described above (FIG. 5C), and a second transition spot TP2 at which the second rest process (4) is performed. The second transition spot TP2 may be the laser spot closest to the fifth portion L30 among a plurality of laser spots of the fourth portion L20. In an embodiment, the preliminary display device may further include the first transition spot TP1 along the outer edge of the display device DD where the first area AA1 having the first thickness and the second area AA2 having the second thickness meet each other, and the beam irradiation line CL may further include a second transition spot TP2 along the outer edge of the display device DD where the rear portion and the boundary area ML meet each other. The irradiating of the laser beam LB may further include performing the first rest process (2) at the first transition spot TP1 and the second rest process (4) at the second transition spot TP2, to provide the beam irradiation line CL having the first line width, the second line width and the third line width.

The second rest process (4) is maintained for a period from about 1 microsecond to about 500 microseconds. In an embodiment, the second rest process (4) is maintained for a period from about 50 microseconds to about 200 microseconds.

As the irradiating method of the laser beam LB includes the second rest process (4), defects in the display device DD may be reduced.

A comparative manufacturing method of the display device DD changes the driving condition and irradiates the laser beam LB while moving the laser unit LS without the rest process in the providing of the beam irradiation line CL in the work panel WB. In this case, the laser beam LB of the second driving condition overlaps the laser beam LB of the third driving condition at a boundary portion AL between the fourth portion L20 and the fifth portion L30. Thus, separation of the display device area P-DD from extended portions of the work panel WB may not be possible.

In the comparative manufacturing method, for instance, when the laser beam LB is irradiated onto the fifth portion L30 having the third stack structure thicker than the second stack structure after the laser unit LS (refer to FIG. 5B) is set to be suitable for the fourth portion L20 having the second stack structure, the laser beam LB with luminous flux insufficient to separate the display device area P-DD is irradiated, and as a result, a defect rate in the display device DD increases.

However, according to one or more embodiment, the number of irradiations of the laser beam LB with luminous flux insufficient to separate the display device area P-DD from a remainder of the work panel WB is relatively low, and thus, the defect rate in the display device DD is reduced.

Although embodiments have been described, it is understood that the invention should not be limited to these embodiments but various changes and modifications can be made by one ordinary skilled in the art within the spirit and scope of the present disclosure as hereinafter claimed. Therefore, the disclosed subject matter should not be limited to any single embodiment described herein, and the scope of the invention shall be determined according to the attached claims.

What is claimed is:

1. A method of manufacturing a display device, comprising:
    providing a preliminary display device comprising:
        a first area including a first stack structure of the display device, the first area having a first thickness, and
        a second area including a second stack structure of the display device which is different from the first stack structure and has a second thickness smaller than the first thickness
        and
    irradiating a laser beam onto the preliminary display device using a laser unit to form a beam irradiation line corresponding to an outer edge of the display device,
    wherein the irradiating of the laser beam comprises:
        a first irradiation process which irradiates the laser beam using the laser unit under a first driving condition to provide a first portion of the beam irradiation line which corresponds to the outer edge of the display device at the first area;
        after the first irradiation process, a first rest process which stops driving of the laser unit and changes the first driving condition of the laser unit to a second driving condition which is different from the first driving condition; and
        after the first rest process, a second irradiation process which irradiates the laser beam using the laser unit under the second driving condition of the laser unit to provide a second portion of the beam irradiation line which corresponds to the outer edge of the display device at the second area.

2. The method of claim 1, wherein the beam irradiation line has a closed line shape.

3. The method of claim 1, wherein the second portion of the beam irradiation line has a curved shape.

4. The method of claim 3, wherein the curved shape is a portion of the second portion of the beam irradiation line which is closest to the first portion of the beam irradiation line.

5. The method of claim 1, wherein the irradiating of the laser beam further comprises maintaining the first rest process from about 1 microsecond to about 500 microseconds.

6. The method of claim 1, wherein the preliminary display device further comprises:
    a display panel which displays an image, the display panel in both the first stack structure of the first area and the second stack structure of the second area;
    a polarizing layer facing the display panel, the polarizing layer in the first stack structure of the first area and excluded from the second stack structure of the second area; and
    a protective layer facing the polarizing layer with the display panel therebetween, the protective layer in both the first stack structure of the first area and the second stack structure of the second area.

7. The method of claim 1, wherein the preliminary display device further comprises a third area including a third stack structure which is different from the first stack structure and the second stack structure and has a third thickness smaller than the first thickness.

8. The method of claim 6, wherein
    the preliminary display device further comprises a third area including a third stack structure which is different from the first stack structure and the second stack structure and has a third thickness smaller than the first thickness,
    each of the display panel and the protective layer is further in the third stack structure of the third area, and
    at the second area, a groove is defined in the protective layer.

9. The method of claim 1, wherein the preliminary display device further comprises a third area including a third stack structure which is different from the first stack structure and the second stack structure and has a third thickness smaller than the first thickness, and
    the irradiating of the laser beam further comprises:
        after the second irradiation process, a second rest process which stops the driving of the laser unit and changes the second driving condition of the laser unit to a third driving condition of the laser unit which is different from the first driving condition and the second driving condition, and
        after the second rest process, a third irradiation process which irradiates the laser beam using the laser unit under the third driving condition of the laser unit to provide a third portion of the beam irradiation line which corresponds to the outer edge of the display device at the third area.

10. The method of claim 1, wherein
    each of the first driving condition of the laser unit and the second driving condition of laser unit has a frequency, a power and a moving speed of the laser beam, and at least one of the frequency, the power and the moving speed of the laser beam of the first driving condition of the laser unit is different from that of second driving condition of the laser unit.

11. The method of claim 10, wherein
the frequency and the moving speed of the laser beam of the first driving condition of the laser unit are the same as the frequency and the moving speed of the laser beam of the second driving condition of the laser unit, respectively, and
the power of the laser beam of the first driving condition of the laser unit is different from the power of the laser beam of the second driving condition of the laser unit.

12. The method of claim 1, wherein each of the first portion and the second portion of the beam irradiation line has a line width,
further comprising repeating the first irradiation process, the first rest process and the second irradiation process for n times (where 'n' is a natural number equal to or greater than 2) to provide the line width of the first portion of the beam irradiation line which is different from the line width of the second portion of the beam irradiation line.

13. The method of claim 1, wherein
the preliminary display device further comprises a transition spot along the outer edge of the display device where the first area having the first thickness and the second area having the second thickness meet each other, and
the irradiating of the laser beam further comprises performing the first rest process at the transition spot.

14. A method of manufacturing a display device, comprising:
providing a preliminary display device comprising:
a first area including a first stack structure of the display device, the first area having a first thickness, and
a second area including a second stack structure of the display device which is different from the first stack structure and has a second thickness smaller than the first thickness, and
irradiating a laser beam onto the preliminary display device using a laser unit to form a beam irradiation line corresponding to an outer edge of display device,
wherein the irradiating of the laser beam comprises:
a first irradiation process which irradiates the laser beam using the laser unit under a first driving condition of the laser unit to provide a first portion of the beam irradiation line which corresponds to the outer edge of the display device at the first area;
after the first irradiation process, a first rest process which stops driving of the laser unit;
after the first rest process, a second irradiation process which irradiates the laser beam under a second driving condition of the laser unit which is different from the first driving condition of the laser unit to provide a second portion of the beam irradiation line which corresponds to the outer edge of the display device at the second area, and
performing each of the first irradiation process, the first rest process and the second irradiation process n times (where 'n' is a natural number equal to or greater than 2), to provide the beam irradiation line having a plurality of line widths,
wherein the beam irradiation line having the plurality of line widths provided by performing each of the first irradiation process, the first rest process and the second irradiation process n times comprises:
the first portion of the beam irradiation line having a first line width, and
the second portion of the beam irradiation line including:
a rear portion having a second line width different from the first line width, and
a boundary portion which connects the first portion to the rear portion, the boundary portion having a third line width which is smaller than the first line width and larger than the second line width.

15. The method of claim 14, further after providing the beam irradiation line having the plurality of line widths, separating the display device from the preliminary display device at the beam irradiation line having the plurality of line widths.

16. The method of claim 14, wherein
the boundary portion has a length defined along the outer edge of the display device, and
the length of the boundary portion is from about 1 micrometer to about 30 micrometers.

17. The method of claim 14, wherein
the preliminary display device further comprises a third area including a third stack structure which is different from the first stack structure and the second stack structure and has a third thickness smaller than the first thickness, and
the irradiating of the laser beam further comprises:
after the second irradiation process, a second rest process comprising stopping the driving of the laser unit, and
after the second rest process, a third irradiation process which irradiates the laser beam under a third driving condition of the laser unit which is different from the first driving condition of the laser unit and the second driving condition of the laser unit to provide a third portion of the beam irradiation line which corresponds to the outer edge of the display device at the third area.

18. The method of claim 14, wherein
the preliminary display device further comprises a transition spot along the outer edge of the display device where the first area having the first thickness and the second area having the second thickness meet each other, and
the irradiating of the laser beam further comprises performing the first rest process at the transition spot to provide the beam irradiation line having the first line width and the second line width.

19. The method of claim 17, wherein
the preliminary display device further comprises a first transition spot along the outer edge of the display device where the first area having the first thickness and the second area having the second thickness meet each other,
the beam irradiation line further comprises a second transition spot along the outer edge of the display device where the rear portion and the boundary portion meet each other, and
the irradiating of the laser beam further comprises performing the first rest process at the first transition spot and the second rest process at the second transition spot, to provide the beam irradiation line having the first line width, the second line width and the third line width.

\* \* \* \* \*